United States Patent

Wong et al.

[11] Patent Number: 5,874,362
[45] Date of Patent: Feb. 23, 1999

[54] BROMINE AND IODINE ETCH PROCESS FOR SILICON AND SILICIDES

[75] Inventors: Jerry Yuen-Kui Wong, Union City; David Nin-Kou Wang, Cupertino; Mei Chang, San Jose; Alfred W. S. Mak, Union City; Dan Maydan, Los Altos Hills, all of Calif.

[73] Assignee: Applied Materials, Inc., Santa Clara, Calif.

[21] Appl. No.: 639,411

[22] Filed: Apr. 29, 1996

Related U.S. Application Data

[63] Continuation of Ser. No. 229,863, Apr. 19, 1994, abandoned, which is a continuation of Ser. No. 084,333, Jun. 28, 1993, abandoned, which is a continuation of Ser. No. 855,124, Mar. 18, 1992, abandoned, which is a continuation of Ser. No. 709,809, May 31, 1991, abandoned, which is a continuation of Ser. No. 587,523, Sep. 21, 1990, abandoned, which is a continuation of Ser. No. 363,429, Jun. 5, 1989, abandoned, which is a continuation of Ser. No. 251,928, Sep. 29, 1988, abandoned, which is a continuation of Ser. No. 944,491, Dec. 19, 1986, abandoned.

[51] Int. Cl.$^6$ .................................................. H01L 21/00
[52] U.S. Cl. ........................... 438/719; 438/710; 252/79.1
[58] Field of Search .................. 204/192.32, 192.37, 204/192.35; 156/345, 645, 655, 656, 657, 662, 663; 252/79.1; 438/719, 710

[56] References Cited

U.S. PATENT DOCUMENTS

| | | | |
|---|---|---|---|
| 3,669,774 | 6/1972 | Dismukes | 156/17 |
| 3,925,120 | 12/1975 | Saida et al. | 148/175 |
| 3,994,793 | 11/1976 | Harvilchuck et al. | 204/192 |
| 4,026,742 | 5/1977 | Fujno | 252/79.1 X |
| 4,141,765 | 2/1979 | Druminski et al. | 148/175 |
| 4,184,909 | 1/1980 | Chang et al. | 156/643 |
| 4,351,696 | 9/1982 | Radigan | 156/643 |
| 4,374,698 | 2/1983 | Sanders et al. | 156/643 |
| 4,422,897 | 12/1983 | Horwitz | 156/643 |
| 4,668,365 | 5/1987 | Foster et al. | 204/192.23 |
| 4,689,871 | 9/1987 | Mahli | 437/40 |
| 4,690,729 | 9/1987 | Douglas | 156/643 |
| 4,698,900 | 10/1987 | Esquivel | 437/52 |

(List continued on next page.)

FOREIGN PATENT DOCUMENTS

| | | | |
|---|---|---|---|
| 0173583 | 8/1973 | European Pat. Off. | C23C 14/34 |
| 0173583 | 3/1986 | European Pat. Off. | |
| 4859094 | 8/1973 | Japan . | |
| 51-79995 | 1/1977 | Japan | C23F 1/00 |
| 56-137635 | 1/1982 | Japan | H01L 21/302 |
| 57-205981 | 6/1983 | Japan | C23F 1/00 |
| 57-115438 | 1/1984 | Japan | H01L 21/302 |
| 61-127129 | 12/1986 | Japan | H01L 21/302 |
| 62-9633 | 1/1987 | Japan | H01L 21/302 |
| 62-145733 | 6/1987 | Japan | H01L 21/302 |
| 1156004 | 6/1969 | United Kingdom | C23F 1/00 |

OTHER PUBLICATIONS

Hirobe et al, "Reduction of Radiation Damage on Silicon Substrates in Magnetron Reactive Ion Etching," *Journal of hte Electrochemical Society*, vol. 132, No. 4, pp. 938–942, Apr. 1985.

Miyamura et al, "Adsorption of HCl and HBr on Si (111): AES, ELS, and EID Studies,", *Surface Science*, vol. 72, pp. 243–252, 1978.

Shiable et al. "Reactive Ion Etching of Aluminum and Aluminum Alloys in an RF Plasma Containing Halogen Species," *J. Vac. Sci. Technol.*, vol. 15, No .2, pp. 334–337, Mar./Apr. 1978.

(List continued on next page.)

*Primary Examiner*—Nam Nguyen
*Assistant Examiner*—Steven H. Ver Steeg
*Attorney, Agent, or Firm*—Birgit E. Morris; James C. Wilson

[57] ABSTRACT

A process for etching single crystal silicon, polysilicon, silicide and polycide using iodinate or brominate gas chemistry, is disclosed. The iodinate/brominate gas chemistry etches narrow deep trenches with very high aspect ratios and good profile control and without black silicon formation or other undesirable phenomena.

10 Claims, 2 Drawing Sheets

U.S. PATENT DOCUMENTS

| | | | |
|---|---|---|---|
| 4,431,477 | 2/1984 | Zazac | 252/79.1 X |
| 4,450,042 | 5/1984 | Purdes | 156/643 |
| 4,473,436 | 9/1984 | Beinvogl | 252/79.1 X |
| 4,490,209 | 12/1984 | Hartman | 252/79.1 X |
| 4,492,610 | 1/1985 | Okano et al. | 204/192.32 X |
| 4,502,915 | 3/1985 | Carter et al. | 156/643 |
| 4,505,782 | 3/1985 | Jacob et al. | 156/646 X |
| 4,581,099 | 4/1986 | Fukaya et al. | 252/79.1 X |
| 4,613,400 | 9/1986 | Tam et al. | 156/646 X |
| 4,623,417 | 11/1986 | Spencer et al. | 156/345 |
| 4,631,106 | 12/1986 | Nakazato et al. | 156/646 X |
| 4,632,719 | 12/1986 | Chow et al. | 156/646 X |
| 4,648,936 | 3/1987 | Ashby et al. | 156/646 X |
| 4,648,938 | 3/1987 | Ashby et al. | 156/646 X |
| 4,657,628 | 4/1987 | Holloway et al. | 156/643 |
| 4,668,338 | 5/1987 | Maydan et al. | 156/643 |

OTHER PUBLICATIONS

Flamm et al. "Etching and Film Formation in $CF_3Br$ Plasma: Some Qualitative Observations and Their General Implications," *J. Vac. Sci. Technol.*, vol. 17, No. 6, pp. 1341–1347, Nov./Dec. 1980.

Kern, "Chemical Etching of Silicon, Germanium, Gallium Arsenide, and Gallium Phosphide, " *RCA Review*, vol. 39, pp. 278, 293–308, Jun. 1978.

Gregor et al, "Vapor–Phase Polishing of Silicon with $H_2$—HBr Gas Mixtures, "*IBM Journal*, pp. 327–332, Jul. 1965.

Matsuo, "Selective Etching of Si Relative to $SiO_2$ without undercutting by $CBrF_3$ Plasma," *Appl. Phys. Lett.*. vol. 36, No. 9, pp. 768–770, May, 1980.

Tachi et al, "Chemical Sputtering of Silicon by $F^+$, $Cl^+$, and $B^+$ Ions: Reactive Spot Model for Reactive Ion Etching," *J. Vac. Sci. Technol. B*, vol. 4, No. 2, pp. 459–467, Mar./Apr. 1986.

BROMINE AND IODINE ETCH PROCESS FOR SILICON AND SILICIDES

This is a continuation of U.S. application Ser. No. 08/229,863 filed Apr. 19, 1994 now abandoned, which is a continuation of U.S. application Ser. No. 08/084,333 filed Jun. 28, now abandoned, which is a continuation of U.S. application Ser. No. 07/855,124 filed Mar. 18, 1992, now abandoned, which is a continuation of U.S. application Ser. No. 07/709,809 filed May 31, 1991, now abandoned, which is a continuation of U.S. application Ser. No. 07/587,523 filed Sep. 21, 1990, now abandoned, which is a continuation of U.S. application Ser. No. 07/363,429 filed Jun. 5, 1989, now abandoned, which is a continuation of U.S. application Ser. No. 07/251,928 filed Sep. 29, 1988, now abandoned, which is a continuation of U.S. application Ser. No. 06/944,491 filed Dec. 19, 1986, now abandoned.

BACKGROUND OF THE INVENTION

The present invention relates to a process suitable for etching small features and patterns in silicon silicide and polycide at a high etch rate. In particular, the present invention is directed to a process using iodine-containing gas and bromine-containing gas for reproducibly forming high aspect ratio openings such as grooves, holes and trenches in single crystal silicon.

Recently, integrated circuit (IC) technology has advanced from large scale integration (LSI) to very large scale integration (VLSI) and is projected to grow to ultra-large integration (ULSI) over the next several years. This advancement in monolithic circuit integration has been made possible by improvements in the manufacturing equipment as well as in the materials and methods used in processing semiconductor wafers into IC chips. However, at least four factors impose increasingly stringent requirements on the basic integrated circuit fabrication steps of masking, film formation, doping and etching and on technologies such as dielectric isolation. These factors are, first, the incorporation into IC chips of increasingly complex devices and circuits; second, the use of greater device densities and smaller minimum feature sizes and smaller separations; third, the use of composite conductor layers such as the silicides of tungsten, tantalum, titanium and molybdenum and polycides (silicide over polysilicon) and, fourth, the use of the third wafer dimension, depth, as well as the surface area for example, to form buried or trench capacitors.

The ability to etch narrow, deep, high aspect ratio trenches is crucial to the formation of buried or pit capacitors. Also, single crystal silicon trench isolation is used increasingly by semiconductor research scientists as an alternative to other device isolation technologies. The trench dielectric isolation technique potentially has a number of advantages, including relatively small surface area requirements, the potential for small width-to-depth ratios, and vertical wall profiles.

Another important advantage of the trench technology is its relative process simplicity. To create a buried capacitor or a dielectric isolation structure using trench technology involves reactive ion etching (RIE) a groove into the single crystal silicon substrate, oxidizing the sidewalls of the groove or trench, filling the groove with oxide dielectric or polysilicon and planarizing the surface. It should be noted that the single crystal silicon material can be either an epitaxial layer or a bulk silicon substrate or a composite of both.

Achieving the optimum single crystal silicon etch requires reproducible control of a number of factors including: the wall profile; bottom profile; masking material selectivity; etch rate uniformity; and line width loss. There are a number of process variables, of course, such as the choice of chemistry, pressure, flow rates, etc. The complicated effects of these interdependent variables make it difficult to achieve reproducible control of the trench profile, etch rate and other characteristics, particularly in narrow deep trenches, when the width, w, is less than about one micrometer and/or the depth, d, is greater than about five micrometers.

Referring to FIG. 1, the best trench profile for many isolation and buried capacitor applications is the U-shaped profile, which is designated generally by the reference numeral 10. The U-profile 10 is formed in the silicon substrate 11 by parallel vertical sidewalls 12—12 and a bottom 13 that has rounded edges or corners 14—14. The ability to etch vertical sidewalls 12—12 is necessary for dimensional control and a high aspect ratio, particularly at very small trench widths, w, and deep trench depths, d (aspect ratio $A_r = d/w$). The U-shaped bottom 13 with rounded edges 14—14 reduces oxidation-induced stress.

Some of the potentially undesirable profiles that can result from the choice of chemistry and other operating parameters are illustrated schematically in FIGS. 2–5.

FIG. 2 depicts a trench 15 having generally vertical sidewalls 16—16. However, the processing parameters have produced sharp corners 17—17 in trench bottom 18. Stress builds up in such sharp corners during cooling and can cause silicon crystal dislocations that promote current leakage and cracking. This condition also reduces the maximum field strength of buried vertical capacitors.

Another non-rounded trench bottom profile is shown in FIG. 3. Here, trench 20 has substantially vertical sidewalls 21—21, but the bottom edges or corners 22—22 are even more sharply angled than the edges 17—17, FIG. 2. The phenomenon and geometry depicted in FIG. 3, that is, the sharply angled edges 22—22 and convex bottom 23 are termed "trenching".

Still another non-rounded trench bottom profile is shown in FIG. 4, where the non-vertical etch has produced a V-shaped trench 25 having angled sidewalls 26—26 which form a single sharp bottom edge 27.

Finally, FIG. 5 depicts the "bowing" phenomenon which is frequently associated with high rate etching processes. That is, the trench 30 depicted in FIG. 5 has concave or bowed sidewalls 31—31. The primary shortcomings of the bowed profile are an increase in the lateral area of the trench, a corresponding reduction in the area available for active devices, and reduced device densities.

The trench profiles shown in FIGS. 2–5 may be useful in certain applications. For example, although the V-shaped profile 25 requires a greater opening, w, for a given depth, d, than the vertical profiles and, thus, occupies larger wafer surface area, the V-profile can be used to form buried vertical capacitors. However, in general, the U-shaped profile 10 with its rounded bottom and low stress is greatly preferred. As a consequence, it is desirable that any etch process be able to reproduce the U-shaped trench profile 10 as required and to form other profiles such as the V profile 25, if at all, only by choice.

Still another consideration, or problem, associated with narrow trenches is the tendency of the etch rate to decrease as the magnitude of the depth, d, increases relative to that of the opening dimension, w. For an etch reaction to proceed, the reaction product must desorb from the etch surface so that reactant species can adsorb onto the newly exposed area. Typically, as trench opening dimensions, w, become smaller, the local etch rates decrease due to the crowding of competing reaction components.

"Black silicon" is another prevalent etch problem. This condition is caused by the presence of surface contaminants such as residual oxides, which act as localized etch masks. The areas beneath these micromasks are not etched away until the contaminants are completely eroded and, as a consequence, the bottom of the finished trench substrate develops a rough, light-scattering dark surface appearance that is responsible for the name black silicon.

The formation of black silicon is not an insurmountable problem when using fluorinated process chemistries. However, fluorinated chemistries frequently use photoresist as the masking material. Because the selectivity of silicon to resist is only about 3:1, etch depths are limited to about three micrometers using a one micrometer-thick resist mask and fluorinated gas chemistry. Fluorinated chemistries also have other crucial problems which limit their ability to etch narrow deep grooves, including undercutting beneath the mask and the proximity effect (different etch rates for different feature geometries in a wafer).

Chlorinated gas etchant species and oxide masking material are being used to etch deep trenches. However, the otherwise desirable etching characteristics of chlorinated gas (etch anisotropy and high single crystal silicon selectivity to silicon oxide) impart an undesirable effectiveness to the oxide micromasks and thus create black silicon during the etch.

Moreover, it is very difficult to prevent bowing (FIG. 5) when using chlorinated gas chemistry to etch at a high rate (>5,000 Angstroms/minute). Also, the bottom profile is depth-dependent. That is, it is very difficult to obtain the desired rounded bottom profile (FIG. 1) in deep trenches. Finally, when using chlorinated gas chemistry, aspect ratios are limited to about 10:1 for geometries (openings, w) larger than about one micron and to only about 5:1 for geometries smaller than one micron.

One exception (a chlorinated gas chemistry etch which avoids problems such as black silicon), is disclosed in commonly assigned, allowed co-pending patent application Ser. No. 764,981, entitled "Process for Etching Single Crystal Silicon", filed Aug. 12, 1985 now abandoned, in the name of David Wang et al ("Wang patent application"), which is incorporated herein by reference in its entirety. The referenced Wang patent application discloses a single crystal silicon etch in which a chlorinated etching gas doped with $BCl_3$ is adapted for etching relatively narrow, U-shaped trenches 15–20 microns deep without the occurrence of trenching, bowing or black silicon.

In general, however, the above-discussed limitations still apply to the use of fluorinated or chlorinated gas chemistries. That is, fluorinated chemistry typically is accompanied by undercutting and the proximity effect and is limited to the formation of relatively wide shallow grooves or trenches. Chlorinated gas chemistry has profile control problems, is subject to phenomena such as black silicon, and may be limited to relatively large geometries and batch etching systems. Also, such conventional processes provide maximum etch rates of about only 400 Angstroms/minute, which is too low to provide adequate throughput in single wafer etchers and, thus, prevents the industry taking full advantage of the single wafer etcher's potential for etch uniformity.

SUMMARY OF THE INVENTION

Objects

In view of the above discussion, it is one object of the present invention to provide a silicon etch process that is suitable for reproducibly forming deep narrow silicon trenches with a controlled profile.

In particular, it is an object of the present invention to provide a process for etching single crystal silicon and polysilicon that consistently and reproducibly produces deep narrow silicon trenches having a U-shaped profile that is characterized by vertical sidewalls and rounded bottom edges.

It is another object of the present invention to provide an etching process using brominate and gas chemistry for forming deep, narrow, high aspect ratio trenches or grooves at a high etch rate in silicon and without problems such as bowing, trenching or black silicon.

It is also an object of the present invention to provide an etch process which accomplishes the above objectives and is an inherently clean process.

It is still another object of the present invention to provide a process for etching silicides and polycides which accomplishes the above objectives.

SUMMARY

In one aspect, the present invention is embodied in, and the above objects are achieved by a process which comprises exposing a silicon or silicide body in a vacuum chamber to plasma formed from a reactive gas mixture comprising a preselected quantity of gas selected from brominate gas and iodinate gas. Preferably, a magnetic field is applied parallel to the surface of the body to control etch rate, profile and ion bombardment.

The reactive gas mixture comprises the brominate etching gas hydrogen bromide or $CF_2Br_2$, which may be doped with a preselected flow of fluorinate gas such as silicon tetrafluoride, or the iodinate gas hydrogen iodine, which may be doped with a preselected flow of chlorinated gas such as chlorine, silicon tetrachloride or hydrogen chloride. The dopant also can be a mixture of fluorinate plus chlorinate gas such as $CF_2Cl_2$, or $SiCl_4$ plus $SiF_4$.

The reactive gas mixture may include a diluent gas such as helium, argon, nitrogen and hydrogen to improve the process results or minimize damage to the process results. Also, the brominate-based and iodinate-based reactive gas mixtures may be doped with a preselected flow of oxygen to better control profile and obtain higher selectivity.

BRIEF DESCRIPTION OF THE DRAWINGS

The above and other aspects of the present invention are described with regard to the drawings in which.

DETAILED DESCRIPTION OF THE INVENTION

The present invention preferably uses the brominate and iodinate gases HBr (hydrogen bromide), HI (hydrogen iodide) or, alternatively, $CF_2Br_2$ in a low pressure ion-assisted gas chemistry process to form deep grooves and trenches with high aspect ratios, controlled profiles, and without the occurrence of phenomena such as bowing, trenching or black silicon.

In the past, to our knowledge bromine gas chemistry and iodine gas chemistry have not been used for plasma etching of silicon. To our knowledge, the one exception is the brominate gas $CF_3Br$ which can be considered to possess a partially brominate chemistry (3F, 1Br). However, the F:Br ratio of 3:1 in $CF_3Br$ provides unacceptably low etch selectivity to oxide masks. Also, the carbon causes particulates and deposits, resulting in an unacceptably dirty process, particularly for VLSI and ULSI circuits, which are susceptible to even a relatively few, very small particulates. It is believed that $CF_3Br$ is applicable only where etch requirements are not at all stringent.

Figure 1:
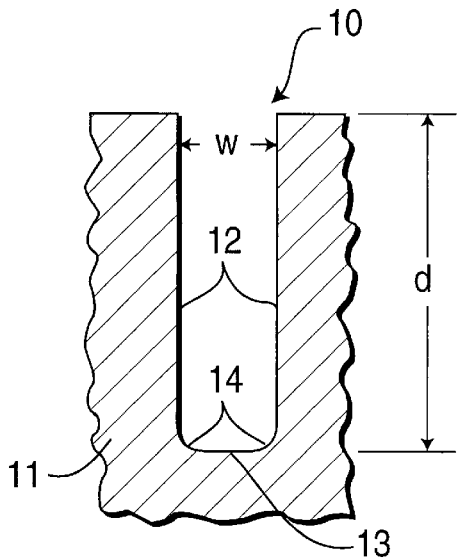
FIG. 1 is a schematic representation of a preferred U-shaped silicon trench profile.
Figure 2:
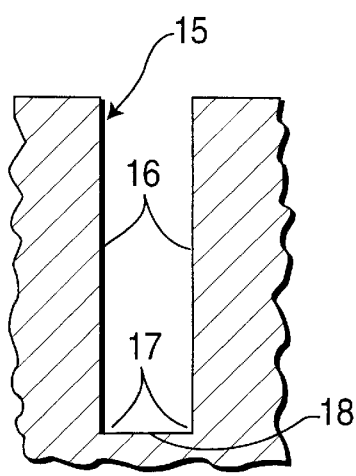
FIGS. 2–5 schematically illustrate other, undesirable or less frequently desirable trench profiles.
Figure 3:
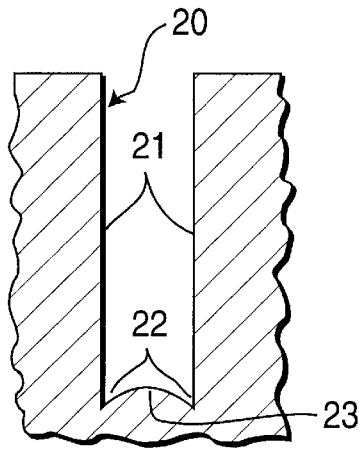
Figure 4:
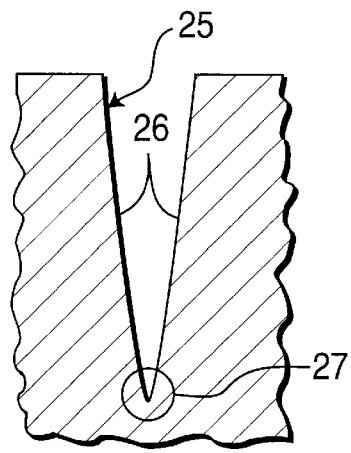
Figure 5:
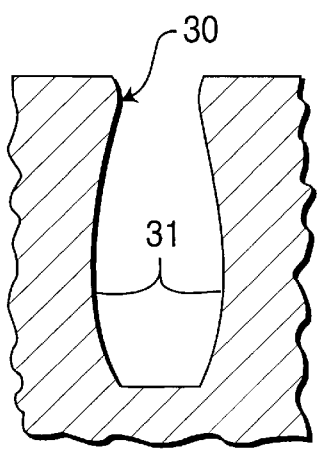

Unexpectedly, we have discovered that the use of HBr brominate and HI iodinate plasma-forming reactant gases can provide very high aspect ratio, deep trenches and unexpectedly high silicon etch rates of about one micron/minute with high selectivity to the etch mask. The process is readily controlled to eliminate sharp edges (FIG. 2), trenching (FIG. 3), V-profiles (FIG. 4) and bowing (FIG. 5). Etch selectivity to oxide is excellent. Furthermore, profile control has been demonstrated in which the desired U-shaped profile (FIG. 1) comprising vertical trench or groove sidewalls 12—12 and rounded bottom edges 14—14 are readily and reproducibly obtained. In addition, fluorinate gases such as $SiF_4$, $SF_6$ and $NF_3$ can be employed as dopants to eliminate the problem of black silicon without cross-contamination or other disadvantages to the etch process. In contrast, it is hard to dope chlorinate gas chemistry with fluorinates without special attention to the trade-offs to the process.

Also, the brominate- and iodinate-based process is clean, that is, free of particulates and deposits which can affect reproducibility when using common gas chemistries such as $CF_3Br$, $CF_2Cl_2$, $CCl_4$, $CH_xCl_y$ to etch single crystal silicon. It is also cleaner than the gases such as $BCl_3$, $Cl_2$ and $SiCl_4$, because fluorine-containing gas can be doped into the process or used as the cleaning agent in the brominate or iodinate chemistry without cross-contamination. Silicon fluoride is considered to be the most volatile etch product among the halogen families. The preferred gases and the preferred dopant gases do not contain carbon or other polymer-forming constituents.

In summary, the brominate and iodinate etching gas chemistry has provided high etch rates (as high as one micron/minute and above) without profile control problems and with very high aspect ratios ($\geq 30:1$) using very small feature sizes (to date, w as small as 0.25–0.5 microns) in a process characterized by cleanliness and devoid of phenomenon such as bowing, trenching and black silicon.

Figure 6:
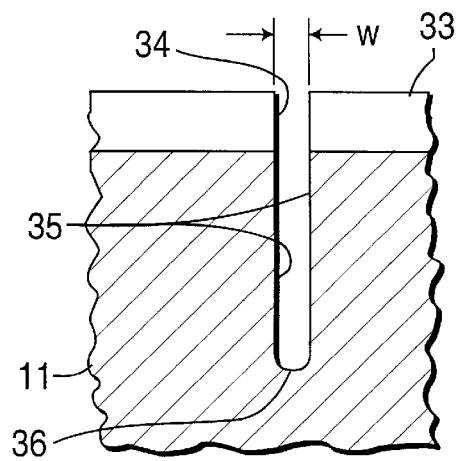
FIG. 6 depicts schematically the etching of a single crystal silicon using the process of the present invention.

Referring to FIG. 6, the above characteristics were demonstrated by etching trenches 35 in silicon wafers 11 using oxide masks 33 approximately 3,000 Angstroms/microns thick thereon having small openings or apertures 34. Etching of the trenches 35 (and all processing disclosed herein) was done using the magnetic field-enhanced, RF driven, reactive etching reactor disclosed in commonly assigned, co-pending patent application Ser. No. 944,843 filed Dec. 19, 1986, now U.S. Pat. No. 5,215,619, entitled "Magnetic Field-Enhanced Plasma Etch Reactor", filed concurrently herewith, in the name of Dana L. Andrews, David Cheng, Mei Chang, Dan Maydan, Sasson Somekh, Kenneth R. Stalder, John M. White, Jerry Y. Wong, Vladimir J. Zeitlin and David N. K. Wang (hereafter referenced as the "referenced etch reactor"), which is incorporated herein by reference in its entirety. Because of attributes such as selectivity, uniformity and cleanliness, the referenced etch reactor is a presently preferred choice for the present etch process. However, other plasma reactors such as the 8300 System available from Applied Materials, Inc., Santa Clara, Calif. can be used to practice our iodinate- and brominate-based etch process. A magnetic field-enhanced, RIE mode plasma etching system is described in allowed, co-pending, commonly assigned U.S. patent application Ser. No. 814,638, entitled "Magnetron-Enhanced Plasma Etching Process", filed Dec. 30, 1985 now U.S. Pat. No. 4,668,338, in the name of Dan Maydan et al. This system is a modification of the magnetic field-enhanced CVD deposition system disclosed in allowed, co-pending, commonly assigned U.S. patent application Ser. No. 664,657, entitled "Apparatus and Method for Magnetron-Enhanced Plasma-Assisted Chemical Vapor Deposition", filed Oct. 25, 1984 now U.S. Pat. No. 4,668,365, in the name of Foster et al. The reactors described in the Maydan et al and Foster et al applications can be used to practice the present invention and are hereby incorporated by reference.

Electrically-Controlled Multi-Directional Magnetic Field Generator

The referenced etch reactor is an RF-powered, magnetic field-assisted reactor which advantageously uses $\overline{E} \times \overline{B}$ fields, with B parallel to the wafer. In addition, a stepped, slowly rotating D.C. field B is used to enhance etch uniformity.

Figure 7:
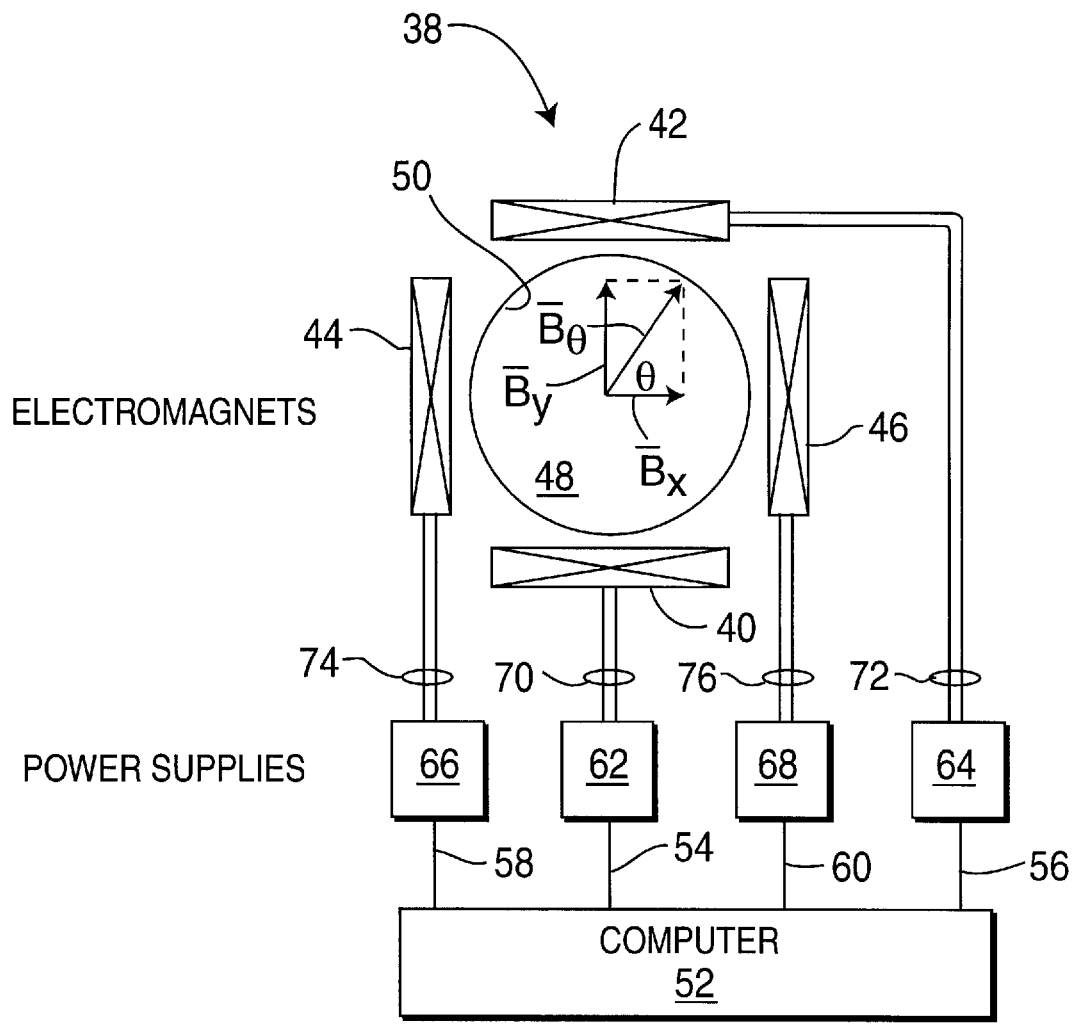
FIG. 7 depicts a preferred system for generating quasi-static, multi-directional, slowly rotating magnetic fields used in the present process.

FIG. 7 is a schematic representation of the system used in the referenced etch reactor for generating and controlling the quasi-static, multi-directional D.C. magnetic field B used in the present invention.

Referring to FIG. 7, two vertical electromagnet coil pairs 40–42 and 44–46 form mutually perpendicular magnetic field vectors $\overline{B}_y$ and $\overline{B}_x$, respectively, which are generally parallel to the wafer-support/cathode and wafer 48 within etch reactor chamber 50. In the exemplary illustration, computer 52 applies control signals via lines or buses 54–60 to conventional power supply systems 62–68 to control the magnitude and direction of the currents supplied over conductors 70–76 and, respectively, to the electromagnets 40–46. electromagnets 40–46. The associated current determines the direction and magnitude of the field generated by each coil pair.

The perpendicular field vectors $\overline{B}_y$ and $\overline{B}_x$ generated respectively by coil pairs 40–42 and 44–46 are defined by $$B_x = B \cos \theta \quad (1),$$

$$B_y = B \sin \theta \quad (2).$$

Given the desired or required values of the field, $\overline{B}$, and its angular orientation $\theta$, the computer 52 can independently solve equations (1) and (2) to obtain the associated magnetic field vectors $\overline{B}_x$ and $\overline{B}_y$ which provide the desired strength of field and orientation and then control application of the necessary electric currents in the coils 40–46 to provide these fields $\overline{B}_y$ and $\overline{B}_x$.

Moreover, the angular orientation $\theta$ and magnitude of this DC magnetic field can be independently altered as quickly or as slowly as desired by changing the current in the coils. The time that the field is on at each angular position and the direction of angular stepping may be varied as well as the field intensity, since these parameters are solely a function of changing the currents to the electromagnets and are readily controlled by computer 52. Thus, the field can be stepped around the wafer using selected orientation and time increments. If desired, the magnitude of the resultant field $\overline{B}_\theta$ can be changed as the process or reactor configuration may require, or a constant field strength can be used. In short, the electrical current-controlled system provides the versatility of a fast or slow moving, constant or varying strength magnetic field of constant or varied angular velocity. In addition, the orientation of the field need not be stepped or changed sequentially, but can be instantaneously switched from any given orientation (or field strength) to another.

This versatility in independently controlling the direction and magnitude of the D.C. magnetic field is distinct from existing commercially useful rotating magnetic fields, which typically rotate at a fixed relatively high frequency such as the standard rate of 60 Hertz. In addition, the ability to "rotate" slowly, at a rate, for example, of 2 to 5 seconds/revolution (0.008 to 0.003 Hz), avoids the eddy current losses associated with the use of higher frequencies in aluminum or metal chambers.

Other reactors can be modified to incorporate the above-described B generating system 38.

Hydrogen Bromide

One presently preferred gas chemistry composition which was used for etching silicon comprises HBr (hydrogen bromide), $SiF_4$ (silicon tetrafluoride), $O_2$ and He. The hydrogen bromide main etchant gas provides a high etch rate and forms inorganic deposit on the sidewalls 35—35 as the trench is being etched, which provides high aspect ratios and generally controls the profile. The silicon tetrafluoride makes the reaction more volatile, and helps to control black silicon and remove etch products. Furthermore, $SiF_4$ can be used alone in an initial cleaning step to remove native oxide from the wafers. The oxygen forms oxides on the oxide mask 33. This protects the oxide mask and enhances the etch process's selectivity to the mask. Additionally, the oxide contributes to the formation of the inorganic sidewall deposits and thus contributes to profile control and high aspect ratios. We have also found that the oxygen controls sidewall taper. That is, increasing the oxygen flow forms inclined sidewalls (similar to V-walls 26—26, FIG. 4, but straight). The angle of inclination and the resulting taper increase with increasing oxygen flow. The helium was used as a diluent and to reduce black silicon.

Please note, the oxygen dopant, which as mentioned is additive to and protective of the oxide masks, permits the use of very thin masks. That is, the thickness of the oxide masks can be one micron or less. We have used thicknesses as small as one-three microns with excellent results. Such ultra-thin masks are easier to pattern and enhance the control and resolution of the etch geometry and the ability to etch small feature sizes.

Hydrogen Iodide

We have also used the iodinate gas hydrogen iodine as the main etching gas for silicon. The iodinate gas preferably is doped with one or more preselected flows of chlorinate gases such as chlorine, silicon tetrachloride or hydrogen chloride as well as a preselected flow of oxygen, both for the purposes described above regarding hydrogen iodide. The chlorinate dopant also increases the silicon etch rate. In addition, a diluent gas such as helium, argon, nitrogen, or hydrogen may be used to dilute the iodinate gas-based reactive etching gas composition. The addition of fluorinated gases such as $SiF_4$, $SF_6$ and $NF_3$ will serve a similar purpose as the chlorinated chemistry.

$CF_2Br_2$

In addition to hydrogen bromide, the brominate etching gas $CF_2Br_2$ can be used for etching silicon. As discussed above, the brominate gas preferably is doped with a preselected quantity/flow of fluorinate gas such as $SiF_4$ and also with a preselected flow of oxygen, for the purposes described above. Further, the reactive gas mixture may be diluted using a diluent gas such as helium, argon and nitrogen.

HBr Etch of Single Crystal Silicon

Referring to Table 1, there is summarized the combination of gas flow rates and other associated operating parameters for the reactive ion etching (RIE) of single crystal silicon using HBr etching gas.

TABLE 1

HBr ETCH OF SINGLE CRYSTAL SILICON

| Process Parameters/Results | Range/Material |
|---|---|
| Total Gas Flow, sccm | 5–110 |
| 1: HBr, sccm | 5–50 |
| 2: $SiF_4$, sccm | 0–15 |
| 3: $O_2$, sccm | 0–10 |
| 4: He, sccm | 0–30 |
| Chamber Pressure, mT | 20–250 |
| RF Power, MHz | 13.56 |
| Power Density, watts/cm$^2$ | 2.4–3.6 |
| Magnetic Field Strength, gauss | 40–100 |
| Magnetic Field Rotation, sec./rev. | 2–5 |
| Mask Material | Silicon dioxide |
| Selectivity to Mask | 10 to ∞ |
| Silicon Etch Rate, Angstroms/min. | 4,000–12,000 |
| opening, w, microns (p) | 0.25–100 |
| Depth, d, inicrons | 0.5–30 |
| Aspect Ratio | 20–25 (for w = 0.25–1.5μ) |

Using the operating parameters summarized in Table 1 including the HBr flow range of 5–50 sccm, the $SiF_4$ silicon tetrafluoride flow range of 0–15 sccm, the oxygen range of 0–10 sccm and the helium range of 0–30 sccm and a wafer supporting RF cathode which is cooled to about 60° C., we have presently etched trenches having opening dimensions, w, as small as about 0.25 micron, with aspect ratios in the range of 20–25.

Considering specific examples, for trench widths, w, of 0.25, 0.4 and 1.5 micron, respectively, we have used the Table 1 process to etch trenches to depths, d, of 5 microns, 10 microns and 30 microns, respectively, thereby providing associated aspect ratios d/w of 5/0.25, 10/0.4 and 30/1.5 or 20, 25 and 20 for the respective opening sizes 0.25, 0.4 and 1.5. We have also obtained selectivity within the range 10 to ∞, the latter figure being obtained for doped oxide masks, namely, phosphosilicate glass (PSG) masks.

The referenced etch reactor is preferred in part because it combines gas-enhanced wafer-to-cathode thermal conductance and liquid cathode cooling. The wafer-supporting cathode 36 (FIG. 7) in the referenced magnetic field-enhanced RF-driven etch reactor 38 can be cooled by water of a temperature of, e.g., 20°–30° C. Gas such as helium gas is applied between the wafer and the water-cooled cathode at a substantially static pressure of about 4 torr. This provides high rate, uniform thermal conductivity between the wafer and the cooled cathode to thereby maintain the wafer temperature of about 60° C. It is important to cool the single wafer to take full advantage of the high power density capability of about 2.5–3.5 watts/cm$^2$. This is approximately one order of magnitude higher than the power density of conventional RIE etchers. This high power density normally has the advantage of a faster etch and of better profile control. The cooling helps to eliminate bowing and black silicon, both of which increase at high temperatures and otherwise facilitates profile control.

It should also be mentioned that the low rate magnetic field rotation of illustratively 2 to 5 sec./rev. promotes very uniform etch rates across the wafer surface. The use of the magnetic field which provides a $\overline{E} \times \overline{B}$ with $\overline{B}$ parallel to the wafer surface enhances the etch characteristics and control. Specifically, the use of the magnetic field in combination with the brominate and iodinate etch chemistries described herein controls the etch and reduces wafer damage. Increasing the magnetic field increases the etch rate and, thus, a given etch rate can be obtained by increasing the magnetic field and decreasing the RF power and the resulting bias voltage $-V_{dc}$. This reduces ion bombardment of the wafer and device damage. At the same time, increasing the magnetic field aids etch profile control. Generally, as a magnetic field is increased, the protective sidewall deposit is thickened (when the oxygen source is present), providing greater taper and less bowing to the trench profile. Since one can change the magnetic field readily, this affords the ability to vary the profile with increasing depth. For example, in very narrow deep trenches it may be desirable to have a wider trench mouth to facilitate subsequent filling of the trench with dielectric. The taper control provided by adjusting the magnetic field permits just such a funnel shaped, wide mouth, narrow bodied trench.

Presently, a total gas flow of about 40 sccm and associated individual gas flows of 20 sccm HBr, 5–10 sccm silicon tetrafluoride, 1 to 4 sccm oxygen, 5 sccm helium and chamber pressure of 100 millitorr (mT) are preferred for the combination of precise reproducibility and combined high rate and profile control.

However, the process is not at all limited to the above-described process parameter values and ranges. For example, based upon experience it is believed that the above process can readily be practiced using silicon tetrafluoride flow rates of 25 sccm and chamber pressures of 5 to 500 millitorr. Furthermore, the process is not sensitive to the flow rate of main gas etchant such as, HBr, which could be much higher than described above.

Also, as mentioned, the flow rates and other parameters are for all the processes disclosed here are for the referenced single wafer etch reactor. The operating parameters including the gas flow rate ratios can be readily adapted to other etch reactors. Also, the process can be adapted to batch reactors in which the flow rate ratios will be increased according to the number of wafers in the batch.

It should be emphasized that the above process provides near infinite selectivity and resulting very high aspect ratios for even very narrow openings, w. For example, we have readily repeatedly obtained five micron deep trenches using 0.25 micron openings (aspect ratio $A_r=5/0.25=20$), ten micron deep trenches using 0.4 micron wide openings ($A_r=10/0.4=25$), and thirty micron deep trenches using 1.5 micron openings ($A_r=30/1.5=20$). However, these are given by way of example only, for we have not reached the limits of the trench depths and aspect ratios for these particular opening dimensions or for even smaller, more narrow openings. In addition, the rounded bottom profile 36, FIG. 6, is consistently obtained and is not depth dependent.

HI Etch of Single Crystal Silicon

Table 2 summarizes the gas flows and other associated process parameters and results for the etching of single crystal silicon using hydrogen iodine (HI). Briefly, a total gas flow of about 50 sccm and individual gas flows of 10–30 sccm hydrogen iodine, 10–20 sccm chlorine, 0–5 sccm oxygen, 0–20 sccm silicon tetrafluoride and 0–10 sccm silicon tetrachloride have been used. The listed high power densities and other operating parameters provided very high single crystal silicon etch rates of 0.9 to 1.2 microns per minute, a selectivity of near infinity for the oxide mask material, and aspect ratios of about 5 (d/w=$5\mu/1\mu$).

Present experience is that, individual gas flows within the approximate ranges of 5–100 sccm hydrogen iodine and 5–30 sccm chlorine can be used readily, along with associated maximum oxygen, silicon tetrafluoride and silicon tetrachloride flows of about 10 sccm, 20 sccm and 20 sccm, respectively.

Our presently preferred gas chemistry is 20 sccm hydrogen iodide doped with 10 sccm chlorine and 2 sccm oxygen, with no silicon tetrafluoride or silicon tetrachloride being required. These parameters provide precise reproducibility and a combination of high etch rate and profile control.

However, the process is not at all limited to the above-described process parameter values and ranges. For example, based upon experience it is believed that the above process can be readily practiced in the referenced etch reactor using silicon tetrafluoride flow rates of 25 sccm and chamber pressures of 5 to 500 millitorr. The process is not sensitive to the main gas etchant, HI, flow rate, which could be used at much higher flow rates than described above. Also, as mentioned the parameters including the gas flow rate ratios can be readily adapted to other etch reactors. Furthermore, the process can be adapted to batch reactors in which the flow rate ratios will be increased according to the number of wafers in the batch.

TABLE 2

HI ETCH OF SINGLE CRYSTAL SILICON

| Process Parameters/Results | Range |
| --- | --- |
| Total Gas Flow, sccm | 5 |
| 1: HI, sccm | 10–30 |
| 2: $Cl_2$ sccm | 10–20 |
| 3: $O_2$, sccm | 0–5 |
| 4: $SiF_4$ | 0–20 |
| 5: $SiCl_4$ | 0–10 |
| Chamber Pressure, mT | 5–200 |
| RF Power, MHz | 13.56 |
| Power Density, watts/$cm^2$ | 2.4–3.6 |
| Magnetic Field Strength, gauss | 50–90 |
| Magnetic Field Rotation, sec./rev. | 1.9–3.6 |
| Mask Material | Silicon dioxide |
| Selectivity to Mask | ∞ |
| Silicon Etch Rate, microns/min. | 0.9–1.2 |
| Aspect Ratio | ~10 |

Other Brominate Gas Chemistries

Because of the above results, HI and HBr are the preferred brominate and iodinate gas chemistries. Hydrogen iodide is the only known iodinate gas. The other brominate gas chemistries $BrF_5$, $BrF_3$, $C_2F_3Br$, $CF_3Br$, $CF_2Br_2$, $C_2Br_2F_4$, $CH_3Br$ and $C_2H_3Br$ contain carbon or hydrocarbons which would provide an unreliable etch process in which organic polymers would form on the wafer and reactor and in the groove or trench. This would limit trench depth and would provide a "dirty" process. Most of these brominate gases contain fluorine (more precisely, a high ratio of fluorine-to-bromine) and, as a result, the selectivity to oxide masks would be low.

Of the other brominate gases listed above, $BrF_5$ and $BrF_3$ are perhaps the "best" choices as etchants. However, both of these gases possess a very high F:Br ratio (5:1 for $BrF_5$ and 3:1 for $BrF_3$), both are highly toxic, and the vapor pressure of $BrF_3$ is very low, i.e., it exists essentially as a liquid.

As demonstrated above, $CF_2Br$ is less desirable than HI or HBr for etching small features such as narrow deep trenches in silicon. Primarily, this is a consequence of its containing carbon and fluorine. However, the F:Br ratio is relatively low, 1:1, such that $CF_2Br$ will be useful for less aggressive (wider) geometries than the preferred HI and HBr gases.

$CF_2Br_2$ Etch of Single Crystal Silicon $CF_2Br_2$ was used to etch single crystal silicon, using a total gas flow of 20–90 sccm and individual gas flows of 10–30 sccm $CF_2Br_2$, 0–20 sccm silicon tetrafluoride, 0–20 sccm $CF_3Br$ and 10–20 sccm oxygen at chamber pressure of 50–300 mT. The resulting high etch rate was 5,000 to 10,000 Angstroms/minute. The selectivity for silicon dioxide masks was about 5–10:1. Trench depths, d, of five microns were obtained for one micron trench widths, w, giving an associated aspect ratio of 5/1. Presently, individual gas flow rates of 30 sccm $CF_2Br_2$, 10 sccm silicon tetrafluoride and 10 sccm oxygen, a chamber pressure of 100 mT, power density of 3 watts/cm$^2$ and a magnetic field of 90 gauss are preferred for the combination of precise reproducibility, high etch rate and profile control.

Present experience indicates that a $CF_2Br_2$ gas flow rate range of approximately 10–50 sccm, maximum dopant flow rates of 30 sccm silicon tetrafluoride, 20 sccm oxygen and 30 sccm $SF_3Br$ can be used along with a chamber pressure within the range of 5–500 mT and will provide the above-described efficacious results.

TABLE 3

$CF_2Br_2$ ETCH OF SINGLE CRYSTAL SILICON RIE ETCH

| Process Parameters/Results | Range |
| --- | --- |
| Total Gas Flow, sccm | 20–90 |
| 1: $CF_2Br_2$, sccm | 10–30 |
| 2: $SiF_4$, sccm | 0–20 |
| 3: $O_2$, sccm | 10–20 |
| 4: $CF_3Br$, sccm | 0–20 |
| Chamber Pressure, mT | 50–300 |
| Power Density, watts/cm$^2$ | 2.4–3.6 |
| Magnetic Field Strength, gauss | 50–90 |
| Magnetic Field Rotation, sec./rev. | 2–5 |
| Mask Material | Silicon dioxide |
| Selectivity to Mask | 5–10:1 |
| Silicon Etch Rate, Angstroms/min. | 5,000–10,000 |
| Aspect Ratio | 5:1 (5$\mu$:1$\mu$) |

Polycrystalline Silicon Etch

Tables 4 and 5 summarize the preferred flow rates and other operating parameters which have been used to etch polycrystalline silicon using the main etching gases hydrogen bromide and hydrogen iodide, respectively. A poly layer of thickness about 500 Angstroms was formed over a thin silicon dioxide underlayer. This structure is frequently used in MOS gate structures and MOS and digital multi-layer conductor structures. A photoresist mask having openings provided the pattern for etching grooves in the polysilicon.

As indicated in Tables 4 and 5, both hydrogen bromide and hydrogen iodine etch the silicon with relatively high etch rates of 3,000 to 5,000 Angstroms per minute (conventional RIE batch system etch rates are about 400–1,000 Angstroms per minute) with very excellent selectivity of 50:1 to the oxide underlayer 38. The hydrogen iodine provided a selectivity to the mask of about 2.5:1 whereas the bromide selectivity to the mask was higher, within the range 4:1 to 8:1.

The above ranges are given by way of example only. It is evident from our present experience that efficacious results are not limited to these ranges alone. In addition, the HBr and HI etch chemistries' selectivity for the photoresist mask can be increased even further by using high pressure and/or low power, i.e., the processes lack of undercutting can be enhanced even further.

TABLE 4

HBr ETCH OF POLYCRYSTALLINE SILICON

| Process Parameters/Results | Range |
| --- | --- |
| Total Gas Flow, sccm | 10–110 |
| 1: HBr, sccm | 10–75 |
| 2: $SIF_4$, sccm | 0–10 |
| 3: $Cl_2$, sccm | 0–15 |
| 4: $O_2$, sccm | 0–10 |
| Chamber Pressure, mT | 10–200 |
| Power Density, watts/cm$^2$ | 2.5–4 |
| Magnetic Field Strength, gauss | 50–90 |
| Magnetic Field Rotation, sec./rev. | 1.9 |
| Mask Material | Photoresist |
| Underlayer Material | Silicon dioxide |
| Selectivity to Mask | 4–8:1 |
| Selectivity to Underlayer | 50:1 |
| Silicon Etch Rate, Angstroms/min. | 3,000–5,000 |

TABLE 5

HI ETCH OF POLYCRYSTALLINE SILICON

| Process Parameters/Results | Range |
| --- | --- |
| Total Gas Flow, sccm | 10–45 |
| 1: HI, sccm | 10–20 |
| 2: $Cl_2$, sccm | 0–20 |
| 3: $O_2$, sccm | 0–5 |
| Chamber Pressure, mT | 20–200 |
| Power Density, watts/cm$^2$ | 2.4–3.6 |
| Magnetic Field Strength, gauss | 50–90 |
| Magnetic Field Rotation, sec./rev. | 1.9 |
| Mask Material | Photoresist |
| Underlayer Material | Silicon dioxide |
| Selectivity to Mask | 2.5 |
| Selectivity to Underlayer | 50:1 |
| Silicon Etch Rate, Angstroms/min. | 3,000–5,000 |

Co-pending, commonly assigned U.S. patent application, Ser. No. 786,783, entitled "Materials and Methods for Etching Silicides, Polycrystalline Silicon and Polycides", filed Oct. 11, 1985 in the name of Wang et al, which is herein incorporated by reference in its entirety, relates to a gas chemistry and a related RIE mode process for etching silicides of the refractory metals titanium, tantalum, tungsten and aluminum and for etching composites of these silicides on polycrystalline silicon layers. The main etching gas composition is $HCl/Cl_2$. The $HCl/Cl_2$ gas chemistry is used in the polysilicon etch step and $BCl_3$-containing $HCl/Cl_2$ gas chemistry is used to etch the silicide, thus providing an essentially continuous silicide and polysilicon etch process in the same chamber without breaking vacuum. The $HCl/Cl_2$ gas chemistry provides high rate anisotropic etching of the underlying polysilicon with selectivity to underlying oxide such as gate oxide layers. BCl$_3$-containing HCl/Cl$_2$ gas chemistry selectively doped with relatively small volumetric amounts of dopant gases selected from fluorinated gases and oxygen not only etches all four refractory metals silicides anisotropically but also provides the required high etch rate ratio of silicide-to-polysilicon to provide a clean filament free etch. In addition, the BCl$_3$/HCl/Cl$_2$ gas chemistry provides a high selectivity to organic photoresist masks and the desired etchability of oxide. In more general terms, the process is consistent with requirements of anisotropic polycide profiles, minimum line width loss, cleanliness, uniformity and reproducibility. Based upon the effectiveness of this oxide and fluorinated gas-doped chlorinated gas chemistry in etching the refractory silicides in addition to polysilicon, as well as the superior results obtained by the present oxygen fluorinate-doped and chlorinate-doped brominate and iodinate gas chemistry in etching polysilicon and single crystal silicon, one skilled in the art will readily develop the specific operating parameters, including gas flow rate ranges, for etching the silicides of titanium, tantalum, tungsten and aluminum and for etching composites of these silicides on silicon layers.

Thus, we have described a preferred process for forming high aspect ratio, U-shaped trenches in single crystal silicon using reactive ion etching. We have also described working ranges for the process parameters and alternatives for parameters such as etchant gas compositions. Based upon the description contained in the specification, claims and drawing, those of skill in the art will readily modify the invention in many aspects which are within the scope of the invention as defined by the claims herein.

What is claimed is:

1. A method of anisotropically etching a high aspect ratio, straight walled opening in silicon, said opening having a rounded bottom which comprises:

a) forming a plasma from a precursor gas etch mixture of HBr as the main etchant, oxygen to provide protection for the sidewalls of the openings and to control selectivity with respect to an oxide etch mask, and a fluorine-containing gas to remove residual contaminants from the sidewalls of the openings, and b) etching said silicon body until an opening of the desired depth has been formed.

2. A method according to claim 1 wherein a carrier gas is added to said precursor etchant gas.

3. A method according to claim 2 wherein said carrier gas is helium.

4. A method according to claim 1 wherein said plasma is formed in the presence of a magnetic field parallel to said body.

5. A method according to claim 1 wherein said aspect ratio is at least about 20:1.

6. A method according to claim 1 wherein said fluorine-containing gas is SiF$_4$.

7. A method according to claim 1 wherein the mixture also contains a diluent gas.

8. A plasma etch process for anisotropically etching straight walled openings in a silicon body, said openings having rounded bottoms using a plasma precursor gas mixture composed of HBr as the main etchant, oxygen to provide protection for the sidewalls of the openings and to control selectivity with respect to an oxide etch mask, and a silicon-fluorine compound to remove residual contaminants from the sidewalls of the openings, and helium as a carrier gas.

9. A process according to claim 8 wherein the silicon-fluorine compound is SiF$_4$.

10. A process according to claim 8 wherein said plasma is generated in the presence of a magnetic field parallel to the surface of said silicon body.

* * * * *